(12) United States Patent
Tanaka

(10) Patent No.: US 8,029,651 B2
(45) Date of Patent: Oct. 4, 2011

(54) METHOD FOR FORMING MAGNETIC LAYER, MAGNETIC RECORDING MEDIUM, AND MAGNETIC RECORDING AND REPRODUCING APPARATUS

(75) Inventor: Takashi Tanaka, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/614,999

(22) Filed: Nov. 9, 2009

(65) Prior Publication Data

US 2010/0128390 A1 May 27, 2010

(30) Foreign Application Priority Data

Nov. 13, 2008 (JP) ................ P2008-291031

(51) Int. Cl.
*C23C 14/34* (2006.01)
(52) U.S. Cl. ................ 204/192.2; 204/298.07
(58) Field of Classification Search ........... 204/192.2, 204/298.07
See application file for complete search history.

(56) References Cited

U.S. PATENT DOCUMENTS

| | | | | |
|---|---|---|---|---|
| 5,228,968 A | * | 7/1993 | Zejda | 204/298.07 |
| 5,490,910 A | * | 2/1996 | Nelson et al. | 204/192.15 |
| 6,068,738 A | * | 5/2000 | Bjornard et al. | 204/192.12 |
| 7,141,145 B2 | * | 11/2006 | Brucker et al. | 204/192.2 |
| 2002/0187368 A1 | | 12/2002 | Senzaki et al. | |
| 2005/0011756 A1 | | 1/2005 | Shibamoto et al. | |
| 2006/0121319 A1 | * | 6/2006 | Wu et al. | 428/836.2 |
| 2006/0289294 A1 | * | 12/2006 | Racine et al. | 204/192.2 |
| 2008/0217170 A1 | | 9/2008 | Shibamoto et al. | |

FOREIGN PATENT DOCUMENTS

| | | | |
|---|---|---|---|
| JP | 2002-342908 A | | 11/2002 |
| JP | 2003-882519 | * | 7/2003 |
| JP | 2004-346406 A | | 12/2004 |

OTHER PUBLICATIONS

Machine Translation of Japan 2003-882519 dated Jul. 4, 2003.*
M. Zheng, et al., "Role of Oxygen Incorporation in Co-Cr-Pt-Si-O Perpendicular Magnetic Recording Media", IEEE Transactions on Magnetics, Jul. 2004, pp. 2498-2500, vol. 40, No. 4.

* cited by examiner

*Primary Examiner* — Rodney McDonald
(74) *Attorney, Agent, or Firm* — Sughrue Mion, PLLC

(57) ABSTRACT

The invention provides a method of forming a magnetic layer with stable magnetic properties and stable recording-and-reproducing properties, by uniformizing the distribution of oxygen radical concentration upon reactive sputtering, and thereby uniformizing the concentration of oxygen to be taken into the magnetic layer along the plane direction. That is, the invention relates to a method of forming a magnetic layer by reactive sputtering, which comprises: placing a substrate in a reaction container; arranging a pair of electrode units comprising sputtering electrodes and targets which are disposed on surfaces of the sputtering electrodes and which contain chromium other than the oxide thereof, so that the electrode units respectively face both sides of the substrate while the targets are on the substrate sides; feeding an argon-water mixture gas to vicinities of the respective surfaces on the substrate sides of the pair of electrode units; and applying reactive sputtering so that the chromium other than the oxide thereof contained in the targets can be made into chromium oxide as a constituent to form the magnetic layer having the granular structure.

12 Claims, 4 Drawing Sheets

METHOD FOR FORMING MAGNETIC LAYER, MAGNETIC RECORDING MEDIUM, AND MAGNETIC RECORDING AND REPRODUCING APPARATUS

BACKGROUND OF THE INVENTION

1. Field of the Invention

The invention relates to a method of forming a magnetic layer by reactive sputtering, and more specifically to a method of forming a magnetic layer of a perpendicular magnetic recording medium for use in a hard disk drive or the like, a magnetic recording medium, and a magnetic recording and reproducing apparatus.

Priority is claimed on Japanese Patent Application No. 2008-291031, filed Nov. 13, 2008, the content of which is incorporated herein by reference.

2. Background Art

In recent years, magnetic recorders such as magnetic disk units, flexible disk units, and magnetic tape units have been used over a remarkably wider range of applications, and play more important roles. With this trend, an attempt is being made to highly increase the recording density of magnetic recording media for use in such recorders. In particular, the surface recording density of a HDD (hard disk drive) has been vigorously increasing since the introduction of an MR head and PRML technology. Moreover, since a GMR head and a TuMR head have also been introduced in recent years, the surface recording density keeps increasing at a rate as high as about 100% per year.

Meanwhile, as for a magnetic recording system of a HDD, a so-called perpendicular magnetic recording system has become popular rapidly in recent years as a substitute technology for a conventional longitudinal magnetic recording system (a recording system in which the magnetization direction is oriented parallel to the substrate plane).

In the perpendicular magnetic recording system, crystal grains in a recording layer in charge of data-recording have their easy-magnetization axes perpendicular to a substrate. The term "easy-magnetization axis" refers to an axis along which magnetization occurs easily. In the case of a typical cobalt (Co) alloy, an axis parallel to the normal line of the (0001)-plane in the Co hcp structure (c-axis) serves as the easy-magnetization axis.

In the perpendicular magnetic recording system, the easy-magnetization axes of magnetic crystal grains are vertical. Therefore, this system features a resistance, even if higher recording densification is advanced, against influences from demagnetizing fields which are formed between recording bits, and thus is magnetostatically stable.

The perpendicular magnetic recording medium typically comprises a structure in which a ground layer, an inner layer (orientation control layer), a magnetic recording layer, and a protective layer are formed in this order on a nonmagnetic substrate. In addition, on completion of the formation of the protective layer, the surface is often coated with a lubricant layer.

Moreover, in many cases, a magnetic film called a soft magnetic underlayer is provided under the ground layer. The ground layer and the inner layer are formed in order to improve the properties of the magnetic recording layer. Specifically, they act to align the crystal orientation of the magnetic recording layer as well as regulating the shape of the magnetic crystal.

For the higher recording densification of the perpendicular magnetic recording medium, it is necessary to concurrently achieve thermal stability and a low-noise state. Two methods are usually employed to reduce noise. The first one is a method in which magnetic crystal grains in the recording layer are magnetically separated and isolated to thereby reduce the magnetic interaction between magnetic crystal grains. The second one is a method in which the sizes of the magnetic crystal grains are made smaller. Specifically, for example, a method can be enumerated in which $SiO_2$ or the like is added to a recording layer to thereby foam a perpendicular magnetic recording layer having a so-called granular structure, where magnetic crystal grains are surrounded by $SiO_2$-rich grain boundary regions or the like (for example, see Japanese Unexamined Patent Application, First Publication No. 2002-342908).

As a method of forming a perpendicular magnetic recording layer having such a granular structure, a method has been disclosed in which a recording layer of a granular structure is formed by using a composite target which contains a CoCrPt alloy and $SiO_2$ by DC magnetron sputtering in an argon-oxygen mixture gas atmosphere (IEEE Transactions on Magnetics, Vol. 40, No. 4, July 2004, pp. 2498-2500). This document reported that the coercive force was enhanced and the recording-and-reproducing properties were improved by performing reactive sputtering in an oxygen-containing atmosphere.

In addition, it is also reported that the optimum oxygen partial pressure is determined by the $SiO_2$ concentration, that the optimum oxygen partial pressure increases as the $SiO_2$ concentration decreases, and that the magnetic properties and the recording-and-reproducing properties are considerably impaired when the oxygen concentration becomes excessive beyond the optimum value.

Furthermore, Japanese Unexamined Patent Application, First Publication No. 2004-346406 disclosed a sputtering apparatus capable of uniformizing the film thickness, the film quality, and the film characteristics by, upon introduction of a sputtering gas and a reactive gas into a vacuum chamber in order to form a film by reactive sputtering, uniformizing the concentration of the reactive gas which flows along the surface of a target and thereby uniformizing the reaction between the reactive gas and the target. This apparatus is a sputtering apparatus for depositing a film on a substrate by arranging a cathode having at least one target so that the cathode faces the substrate, and sputtering the target on the basis of reactive sputtering, wherein the apparatus comprises a central gas-introduction mechanism by which the reactive gas supplied from a reactive gas feeding device flows outward from the central part of the cathode unit along the surface of the target.

Incidentally, upon such reactive sputtering in an oxygen-containing atmosphere, an event can be seen in which the concentration of oxygen to be taken into the magnetic layer varies depending on the position on the disk, because the distribution of the oxygen radical concentration is nonuniform in the sputtering chamber. This causes an inconvenience in that it is difficult to achieve uniformization of the magnetic properties and the recording-and-reproducing properties all over the entire surface of the disk.

As a method for solving this inconvenience, the 2nd patent document has disclosed a method in which a reactive gas is allowed to flow outward from the central part of a cathode unit along the surface of the target.

However, although this method can provide the reactive gas per se uniformly to the substrate surface, because of the gas flow, a plasma space formed in the vicinity of the substrate surface flows to the downstream, which makes the plasma space unstable.

Moreover, in this method, the gas flows in between the substrate and the plasma, where a plasma-free space is formed. This plasma-free space inconveniently cancels oxygen radicals being ejected from the plasma space to the substrate surface. This results in a deceleration of the film formation by reactive sputtering, as well as causing a nonuniformity of the magnetic film deposited on the substrate surface and a nonuniformity of the film thickness distribution.

Under such circumstances, there has been a demand for a magnetic layer formation method capable of uniformizing the distribution of the oxygen radical concentration upon reactive sputtering in an oxygen-containing atmosphere. However, in the current situation, an effective and appropriate method has not yet been provided.

SUMMARY OF THE INVENTION

The invention provides a method of forming a magnetic layer with stable magnetic properties and stable recording-and-reproducing properties, by uniformizing the distribution of the oxygen radical concentration upon reactive sputtering, and thereby uniformizing the concentration of oxygen to be taken into the magnetic layer along the plane direction.

BRIEF DESCRIPTION OF THE REFERENCE SYMBOLS

Figure 1:
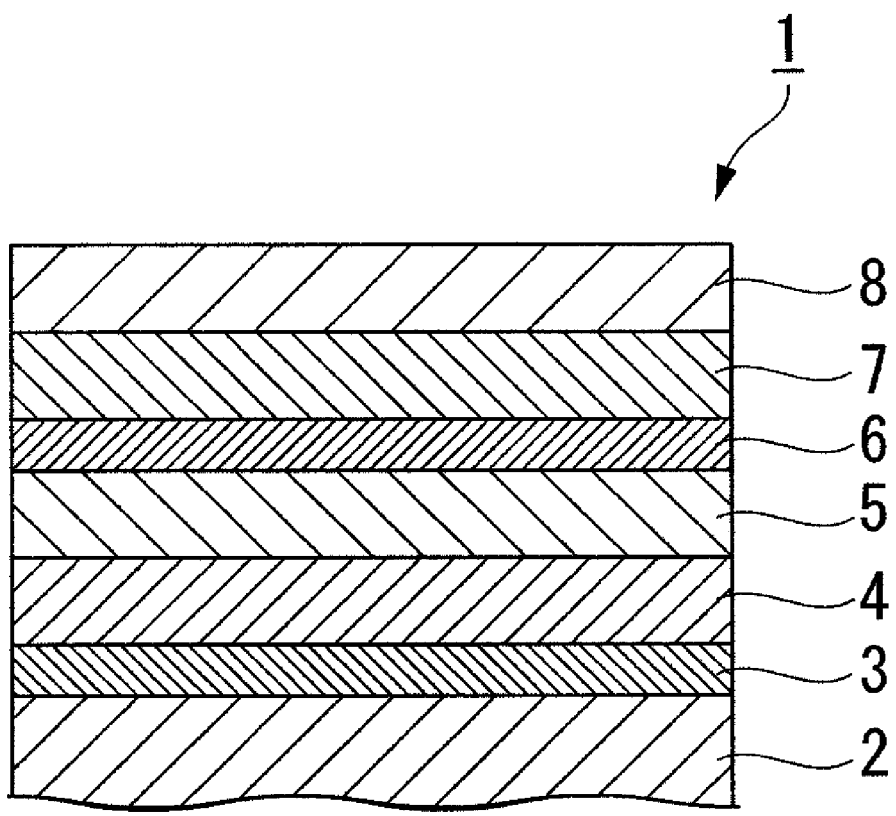
FIG. 1 is a longitudinal cross-sectional view schematically illustrating an example of a perpendicular magnetic recording medium, in which a magnetic layer is formed by the magnetic layer formation method of the invention.

1: Perpendicular magnetic recording medium, 2: Nonmagnetic substrate, 6: Magnetic recording layer, 22: Film-formation substrate, 23: Reaction container, 24: Gas feeder, 25: First exhauster, 26: Second exhauster, 32 to 34: Cathodes, 42 to 44: Targets, 46 to 49: Gas inlet pipes, 51: Annular part, 51 a: Gas outlet aperture, 52 to 54: Vacuum pumps, 70: Magnetic recording and reproducing apparatus, 72: Magnetic head

PREFERRED EMBODIMENTS

In order to achieve the above object, the invention provides the following solutions.

(1) A method of forming a magnetic layer for use in a magnetic recording medium in which a magnetic layer having a granular structure containing at least cobalt and chromium is formed on both sides of a substrate by reactive sputtering, which comprises: placing the substrate in a reaction container; arranging a pair of electrode units comprising sputtering electrodes and targets which are disposed on surfaces of the sputtering electrodes and which contain chromium other than the oxide thereof, so that the electrode units respectively face both sides of the substrate while the targets are on the substrate sides; feeding an argon-water mixture gas to vicinities of the respective surfaces on the substrate sides of the pair of electrode units; and applying reactive sputtering so that the chromium other than the oxide thereof contained in the targets can be made into chromium oxide as a constituent to form the magnetic layer having the granular structure.

(2) The method of forming a magnetic layer according to (1), wherein the target contains cobalt oxide, and reactive sputtering is applied so that the cobalt oxide can be made into cobalt as a constituent to form magnetic grains in the magnetic layer having the granular structure.

(3) The method of forming a magnetic layer according to either (1) or (2), wherein the magnetic layer is formed by reactive sputtering while feeding the argon-water mixture gas to the vicinities of the respective surfaces on the substrate sides of the pair of electrode units so that the gas can flow from the peripheral parts toward the central parts, as well as discharging a post-reaction waste gas from the longitudinally opposite ends of the reaction container.

(4) The method of forming a magnetic layer according to any of (1) to (3), wherein the magnetic layer is a perpendicular magnetic layer whose magnetic anisotropy is perpendicular to the surface of the substrate.

(5) The method of forming a magnetic layer according to any of (1) to (4), wherein the magnetic layer contains, in addition to the chromium oxide, one or more types of oxide(s) selected from the group consisting of Si oxide, Ti oxide, W oxide, Co oxide, Ta oxide, and Ru oxide, as a grain boundary constituent for forming the granular structure.

(6) The method of forming a magnetic layer according to any of (1) to (5), wherein the thickness of the magnetic layer is within a range of 1 nm to 15 nm.

(7) The method of forming a magnetic layer according to any of (1) to (6), wherein the magnetic layer contains oxide(s) within a range of 3 mole % to 15 mole %.

(8) The method of forming a magnetic layer according to any of (1) to (7), wherein the substrate is a disk-shaped substrate for use in a magnetic recording medium, and the magnetic layer having the granular structure is a magnetic recording layer in the magnetic recording medium.

(9) The method of forming a magnetic layer according to any of (1) to (8), which comprises: arranging on the substrate sides of the pair of electrode units, a gas inlet pipe whose inner peripheral wall is provided with a plurality of gas outlet apertures annularly along the circumference; and introducing the mixture gas into the gas inlet pipe and discharging the gas from the respective gas outlet apertures to thereby feed the mixture gas to the vicinities of the respective surfaces on the substrate sides of the pair of electrode units, so that the gas flows from the peripheral parts toward the central parts.

(10) The method of forming a magnetic layer according to any of (1) to (9), wherein an exhauster device for discharging the waste gas comprises a turbo-molecular pump.

(11) The method of forming a magnetic layer according to any of (1) to (10), wherein an exhauster device for discharging the waste gas comprises a cryopump.

(12) The method of forming a magnetic layer according to any of (1) to (11), wherein the method employs an apparatus which comprises a first exhauster for discharging the waste gas from one longitudinal end of the reaction container and a second exhauster for discharging the gas from the other end, and at least either one of these exhausters has two vacuum pumps.

(13) The method of forming a magnetic layer according to any of (1) to (12), wherein a plurality of pairs of the electrode units are used, and magnetic layers are formed in parallel on both sides of a plurality of substrates.

(14) A magnetic recording medium comprising a magnetic layer formed by the method of forming a magnetic layer according to any of (1) to (13).

(15) A magnetic recording and reproducing apparatus comprising a magnetic recording medium and a magnetic head for recording data in or reproducing data from the magnetic recording medium, wherein the magnetic recording medium is the magnetic recording medium according to (14).

EFFECTS OF THE INVENTION

In the invention, reactive sputtering is performed by using a water-containing mixture gas. As a result, through the reactive sputtering, water is decomposed into oxygen radicals and hydrogen radicals, so that the distribution of the radical concentration is uniformized in the reaction area.

In addition, the oxygen radicals react with chromium other than the oxide thereof contained in the target, so that the chromium turns into chromium oxide that forms a magnetic layer having a granular structure. That is, because the chromium takes in oxygen to form the magnetic layer, the oxygen concentration in the magnetic layer is uniformized in the plane.

Moreover, due to the reduction effect of the hydrogen radicals, the magnetic grains can be kept from being oxidized. By so doing, stable magnetic properties and stable recording-and-reproducing properties can be given to the magnetic layer.

Moreover, by using a mixture gas made by adding water to argon, the relative amount of argon in the mixture gas decreases. As a result, the hardness of the magnetic layer and the scratch resistance of the magnetic recording medium are improved.

Furthermore, in the invention, cobalt oxide contained in the target is reduced by hydrogen radicals, so that the cobalt oxide turns into cobalt as a constituent of the magnetic grains in the magnetic layer having the granular structure. Therefore, the magnetic grains can be kept from being oxidized, and stable magnetic properties and stable recording-and-reproducing properties can be given to the magnetic layer.

In addition, in the invention, the mixture gas is fed to the vicinities of the surfaces of the pair of electrode units so that the gas flows from the peripheral parts toward the central parts. Therefore, a flow of the mixture gas is canceled by the opposite flow of the mixture gas. For this reason, disturbance of plasma generated in the vicinity of the target caused by a flow of the mixture gas can be avoided, and thereby the plasma space formed in the vicinity of the target can be kept stable. By so doing, the oxygen radicals can be reliably delivered to the substrate side.

Moreover, since the reacted gas is discharged from the opposite ends of the reaction container, the plasma is less likely to flow in a certain direction by the flow of the gas being discharged. By so doing, the gas flows in between the film-formation substrate and the plasma, where the formation of a plasma-free space can be suppressed.

In addition, the film formation method of the invention of this application is capable of smoothly feeding and discharging the water-containing mixture gas. Therefore, water which has been so far difficult to introduce because it impairs the base pressure of the vacuum device, can be added without hesitation.

Through these events, the film formation by reactive sputtering can be accelerated, the magnetic layer deposited on the substrate surface can be uniformized, and stable magnetic properties and stable recording-and-reproducing properties can be given to the magnetic layer.

Hereunder is a detailed description of the magnetic layer formation method serving as an embodiment of the invention, with reference to drawings.

First is a description of an example of a perpendicular magnetic recording medium which comprises the magnetic layer formed by the invention.

FIG. 1 is a longitudinal cross-sectional view illustrating the perpendicular magnetic recording medium which comprises the magnetic layer formed by the invention.

The perpendicular magnetic recording medium 1 of the embodiment shown in FIG. 1 has a structure in which, on each of both sides of a nonmagnetic substrate 2, respectively, at least a soft magnetic underlayer 3, an orientation control layer 4 for controlling the orientation of a film placed immediately above itself, a ground layer 5, a magnetic recording layer (magnetic layer) 6, a protective layer 7, and a lubricant layer 8 are laminated in this order. The magnetic recording layer 6 is a perpendicular magnetic recording layer having a granular structure which contains at least Co and chromium (Cr).

As for the nonmagnetic substrate 2 used in this perpendicular magnetic recording medium 1, any substrate can be employed so long as it is nonmagnetic, such as an Al—Mg alloy and other Al alloy substrates which consist mainly of Al, and usual substrates made of soda glass, aluminosilicate-based glass, amorphous glasses, silicone, titanium, ceramics, sapphire, quartz, and various types of resins.

Of these, Al alloy substrates and glass substrates made of crystallized glass, amorphous glass, and the like are often used.

In the case of a glass substrate, preferred are mirror-polished substrates and substrates having low surface roughness (Ra) which satisfies (Ra)<1(Å).

Moreover, the nonmagnetic substrate 2 may be slightly scratched to a small degree.

In the production process of the perpendicular magnetic recording medium 1, the nonmagnetic substrate 2 is usually washed and dried at the beginning. In the invention, it is preferable to wash and dry the nonmagnetic substrate 2 prior to the formation of each layer so as to keep the adhesiveness to each layer. The term "wash" does not only mean to "wash with water" but also include to "wash by etching (reverse sputtering)".

In addition, the size of the nonmagnetic substrate 2 is not specifically limited and is suitably determined according to the purpose of application.

The soft magnetic underlayer 3 acts to induce a recording magnetic field from the head, upon recording of a signal into the medium, so as to efficiently apply the perpendicular component of the recording magnetic field to the magnetic recording layer 6.

Regarding the material of the soft magnetic underlayer 3, materials having so-called soft magnetic properties, such as a FeCo-based alloy, a CoZrNb-based alloy, and a CoTaZr-based alloy, can be employed.

It is particularly preferable that the soft magnetic underlayer 3 has an amorphous structure. The reason is that the soft magnetic underlayer having an amorphous structure is able to prevent an increase of the surface roughness (Ra) and to reduce the flying height of the head, enabling higher recording densification.

Moreover, although the soft magnetic underlayer 3 may comprise a monolayer structure of such a soft magnetic layer, it may also have a structure in which a very thin nonmagnetic film made of Ru or the like is sandwiched between two soft magnetic layers so that an antiferromagnetic bond is held between these soft magnetic layers.

In addition, it is preferable that the total thickness of the soft magnetic underlayer 3 is normally about 20 nm to 120 nm, and the thickness is suitably determined according to the balance between the recording-and-reproducing properties and the writing properties.

In the invention, the orientation control layer 4 for controlling the orientation of the magnetic recording layer 6 is preferably provided on the soft magnetic underlayer 3. The material of the orientation control layer 4 is preferably Ta or an Ni alloy of such as Ni, Ni—Nb, Ni—V, and Ni—W which allows the fcc(111) crystal plane orientation.

Moreover, even if the soft magnetic underlayer 3 has an amorphous structure, the surface roughness Ra might increase depending on the material and the film formation conditions; in which case, a nonmagnetic amorphous layer is preferably formed between the soft magnetic underlayer 3 and the orientation control layer 4.

By so doing, the surface roughness Ra of the plane for forming the magnetic recording layer 6 can be reduced, and therefore the orientation of the magnetic recording layer 6 can be improved.

The ground layer 5 is provided on the soft magnetic underlayer 3 or the orientation control layer 4.

The material of the ground layer 5 is preferably Ru, Re, or an alloy thereof which takes an hcp structure as the magnetic recording layer 6.

Because the role of the above-mentioned inner layer (orientation control layer 4) is to control the orientation of the magnetic recording layer 6, any material which is able to control the orientation of the magnetic recording layer 6 can be employed even if it does not take an hcp structure.

The total thickness of the ground layer 5 is preferably 5 nm or more and 20 nm or less, in terms of the balance between the recording-and-reproducing properties and the writing properties.

The perpendicular magnetic recording medium 1 in this embodiment comprises a perpendicular magnetic recording layer 6 having a granular structure which contains at least Co and Cr as magnetic grains, and at least chromium oxide in grain boundaries of these magnetic grains. In addition, the magnetic grains also preferably contain Pt.

Moreover, the oxide constituting the grain boundaries preferably contains, in addition to the Cr oxide, one or more types of oxide(s) selected from the group consisting of Si oxide, Ti oxide, W oxide, Co oxide, Ta oxide, and Ru oxide. Examples of ferromagnetic materials containing such oxides can include CoCrPt—Cr oxide-Si oxide, CoCrPt—Cr oxide-Ti oxide, CoCrPt—Cr oxide-W oxide, CoCrPt—Cr oxide-Co oxide, CoCrPt—Cr oxide-Ta oxide, CoCrPt—Cr oxide-Ru oxide, CoRuPt—Cr oxide-Si oxide, and CoCrPtRu—Cr oxide-Si oxide.

In these compositions, roughly, a CoCrPt alloy, a CoRuPt alloy, or a CoCrPtRu alloy constitutes the magnetic grains, while Cr oxide, Si oxide, Ti oxide, W oxide, Co oxide, Ta oxide, or Ru oxide constitutes the grain boundaries. Moreover, oxide(s) may be contained in part in the magnetic grains, and an alloy may be contained in part in the grain boundaries.

It is also possible to add two or more types of these oxides to the magnetic recording layer 6.

The mean diameter of the magnetic grains constituting the perpendicular magnetic recording layer 6 having the granular structure which contains at least Co and Cr is preferably 1 nm or more and 12 nm or less. The mean grain boundary width thereof is preferably 0.3 nm or more and 2.0 nm or less. The mean crystal grain diameter and the mean grain boundary width can be calculated by using a planar TEM observation image.

The total amount of oxide(s) in the perpendicular magnetic recording layer 6 having the granular structure which contains at least Co and Cr is preferably 3 to 15 mole %. When the total addition of the oxide(s) is within this range, an excellent granular structure can be formed by the magnetic layer formation method of the invention.

The thickness of the magnetic layer is preferably within a range of 1 nm to 15 nm.

The protective layer 7 is to protect the medium from being damaged by rubbing between the head and the medium, and uses a carbon film or an $SiO_2$ film, though a carbon film is preferred.

These films are formed by using a sputtering method or a plasma CVD method, though a plasma CVD method is preferred. It is also possible to employ a magnetron plasma CVD method.

The thickness of the protective layer 7 is about 1 nm to 10 nm, preferably about 2 nm to 6 nm, and more preferably 2 nm to 4 nm.

Next is a description of the magnetic layer formation method according to the invention, with reference to an example where the magnetic recording layer 6 of the perpendicular magnetic recording medium 1 shown in FIG. 1 is formed.

Figure 2:
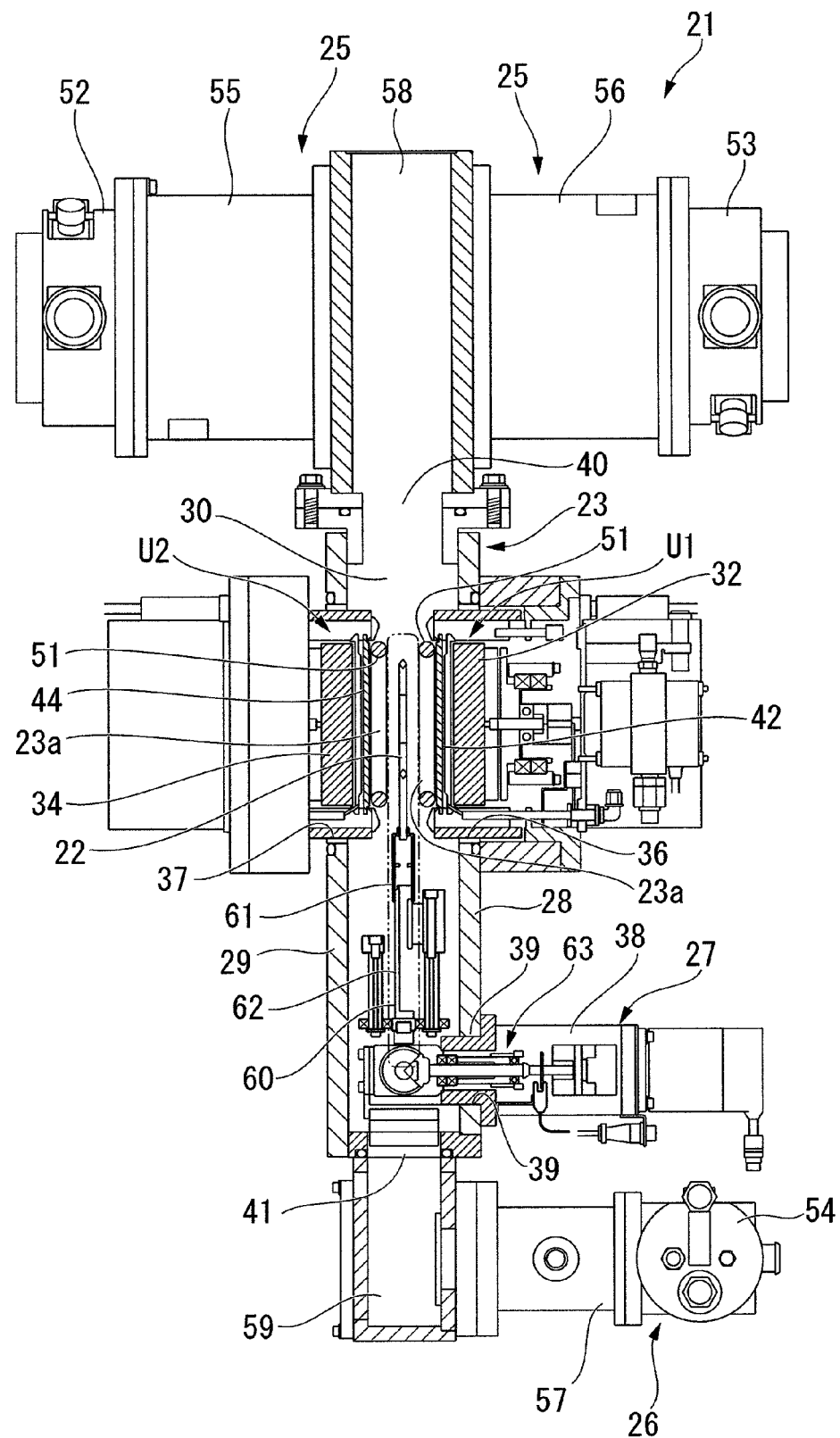
FIG. 2 is a longitudinal cross-sectional view illustrating an example of a film formation apparatus used for the magnetic layer formation method of the invention.
Figure 3:
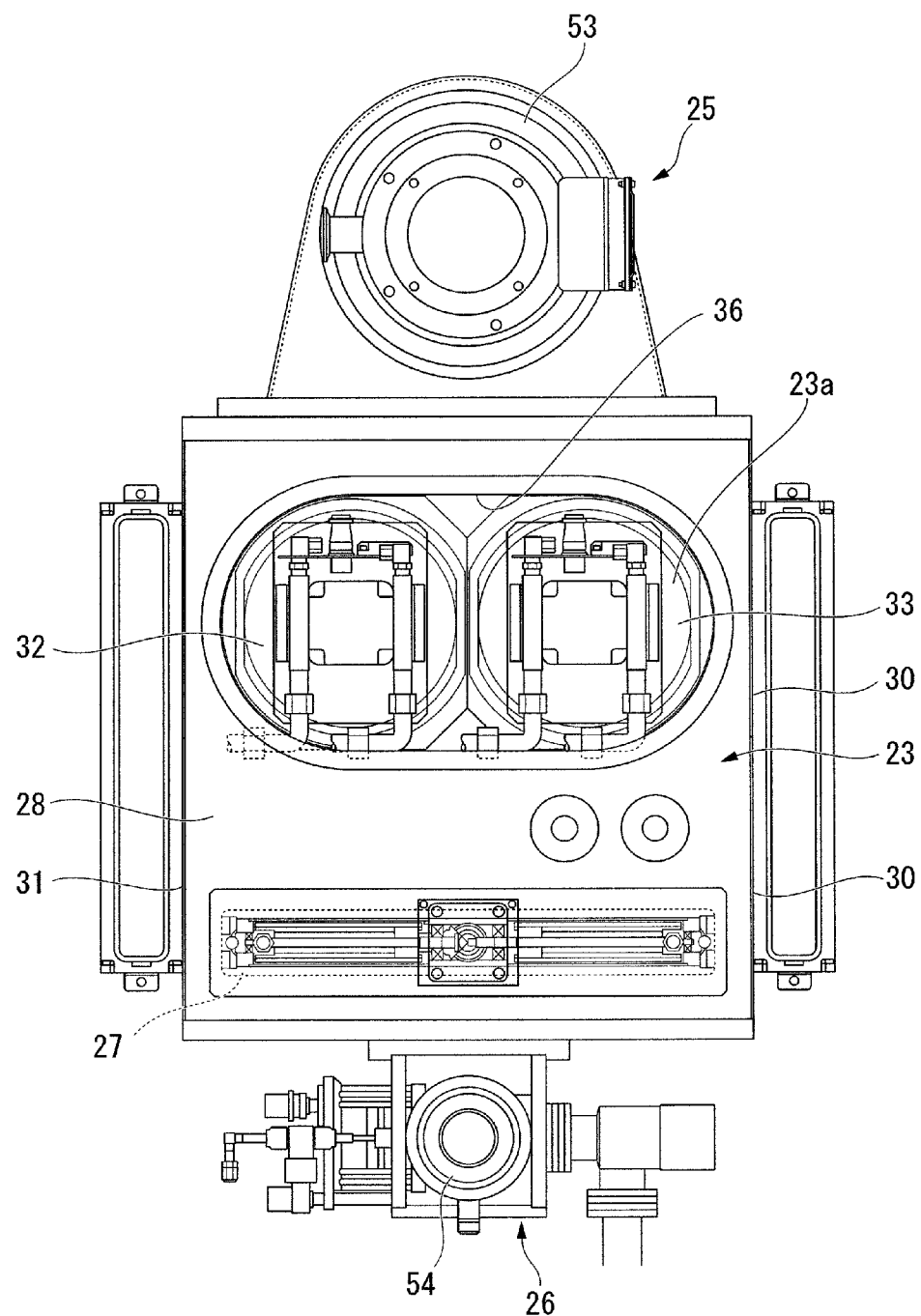
FIG. 3 is a schematic side view of the film formation apparatus of FIG. 2, viewed from the right.
Figure 4:
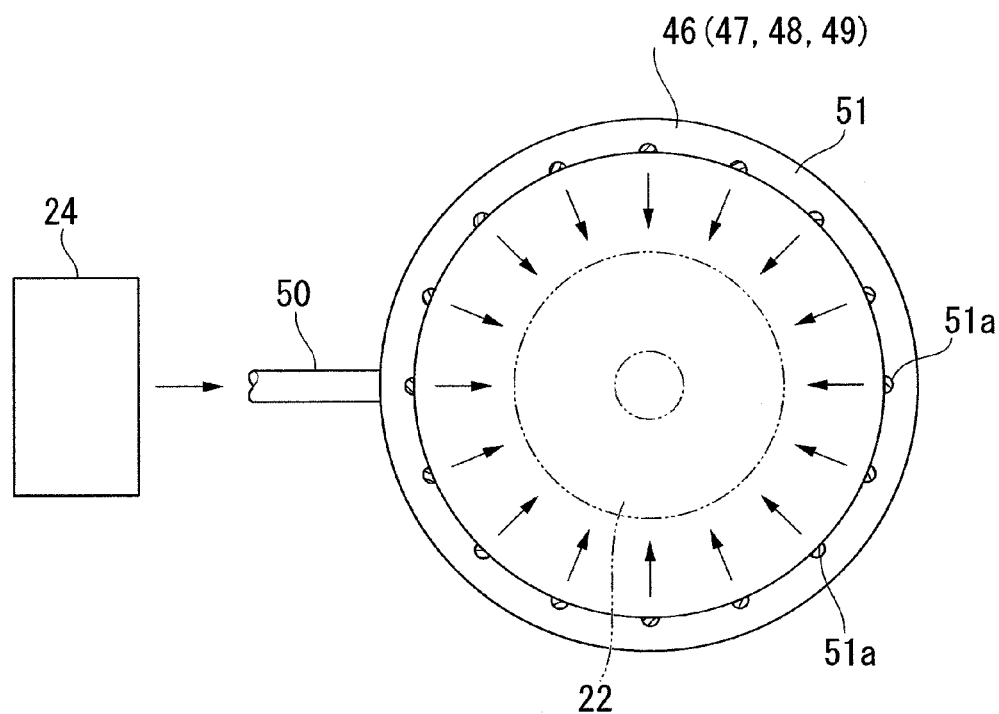
FIG. 4 is a side view illustrating an example of a gas inlet pipe equipped in the film formation apparatus of FIG. 2.

FIG. 2 is a longitudinal cross-sectional view illustrating an example of a film formation apparatus used for the magnetic layer formation method of the invention. FIG. 3 is a side view of the film formation apparatus of FIG. 2, viewed from the right. FIG. 4 is a top view illustrating an example of a gas inlet pipe equipped in the film formation apparatus of FIG. 2.

In this embodiment, the magnetic recording layer 6 having the granular structure is formed by reactive sputtering. First is a description of the film formation apparatus for forming the magnetic recording layer 6 by reactive sputtering.

The film formation apparatus 21 of this embodiment is designed to be capable of concurrently forming magnetic layers (magnetic recording layers 6) on both sides of two film-formation substrates 22. In this embodiment, the film-formation substrate 22 uses a substrate in which soft magnetic underlayers 3, orientation control layers 4, and ground layers 5 have been already formed on the nonmagnetic substrate 2.

The film formation apparatus 21 used in this example comprises: a thin and vertical reaction container (reaction chamber) 23; a gas feeder 24 (see FIG. 4) for feeding a mixture gas containing an inert gas (sputtering gas or plasma producing gas) and a reactive gas, into the reaction container 23; a first exhauster 25 and a second exhauster 26 for discharging the gas from the inside of the reaction container 23; and a substrate conveying device 27 for transferring the two film-formation substrates 22 that have been delivered from the outside, to predetermined positions.

The reaction container 23 is a container which partitions between the outside and the reaction space 23a. As well as being airtight, the container is pressure-tight since the interior is kept high vacuum. In the following description, regarding this reaction container 23 of FIG. 2, the side wall on the right is referred to as a "first side wall 28", the side wall on the left is referred to as a "second side wall 29", the side wall at the rear is referred to as a "third side wall 30", and the side wall at the front is referred to as a "fourth side wall 31" (see FIG. 3).

As shown in FIG. 3, the first side wall 28 and the second side wall 29 each take a vertically-longish rectangular shape that is almost square when viewed from the front, and are placed vertically to have a narrow clearance therebetween so that a flat and vertically-long space can be made as shown in FIG. 2. In addition, both left and right edges of the first side wall 28 and the second side wall 29 are joined to the narrow third side wall 30 and the narrow fourth side wall 31 which are equipped with a gate valve for bringing in and taking out a carrier 61 carrying the film-formation substrates 22. The flat and vertically-long space is enclosed by the side walls 28 to 31 and partitioned as the interior space of the reaction container 23.

In an upper area of the first side wall 28 of this reaction container 23 is provided a first window 36 for attaching a first cathode (sputtering electrode) 32 and a second cathode 33 described later. In the second side wall 29, a second window 37 for attaching a third cathode 34 and a fourth cathode described later, in a left-and-right adjacent manner, is provided to face the first window 36.

As shown in FIG. 3, the first window 36 and the second window 37 each take a race-track shape which is horizontally-long when viewed from the side, and are arranged at the same height to face each other.

Moreover, in the first side wall 28, a small third window 39 for attaching a substrate conveyer 38 described later is provided in a lower area down from the first window 36.

All of the first cathode to the fourth cathode take equivalent structures. Two cathodes are aligned left and right and attached to the first window 36, while the other two cathodes are aligned left and right and attached to the second window 37. Some parts are not shown in FIG. 2 and FIG. 3.

In addition, a first exhaust vent 40 and a second exhaust vent 41 are provided respectively on the top and the bottom of the reaction container.

The first exhaust vent 40 and the second exhaust vent 41 are respectively connected to the first exhauster 25 and the second exhauster 26.

The first side wall 28 of the reaction container 23 is fitted with the first cathode 32 and the second cathode 33, to which is supplied electric power from a power source (not shown). The second side wall 29 is fitted with the third cathode 34 and the fourth cathode, to which is supplied electric power from a power source (not shown).

Specifically, as shown in FIG. 3, the horizontally-aligned first cathode 32 and second cathode 33 are airtightly joined to the horizontally-long first window 36 provided in the first side wall 28, via a frame.

Moreover, the horizontally-aligned third cathode and fourth cathode are airtightly joined to the second window 37 provided in the second side wall 29, via a frame.

In addition, the first cathode 32 to the fourth cathode are vertically placed respectively so that their electrode planes are set approximately orthogonal to the horizontal plane. The first cathode 32 and the third cathode 34 are positioned so that their surfaces on the reaction space 23a side (electrode planes) face each other, while the second cathode 33 and the fourth cathode are positioned so that their surfaces on the reaction space 23a side (electrode planes) face each other.

The first target 42 to the fourth target are separately supported by the electrode planes of the first cathode 32 to the fourth cathode respectively. Each target has a planar shape with a composition that corresponds to the composition of the magnetic layer of interest. In this embodiment, the target has a composition which contains at least chromium and cobalt oxide.

The second target and the fourth target are not shown since they have similar structures to those of the first target 42 and the third target 43.

In this embodiment, a first electrode unit U1 comprising the first cathode 32 and the first target 42 and a third electrode unit U2 comprising the third cathode 34 and the third target 44 are in a pair, while a second electrode unit comprising the second cathode and the second target and a fourth electrode unit comprising the fourth cathode and the fourth target are in a pair.

Each target may be made of either a single substance or a plurality of target pieces. Moreover, the planar shape of each target is not specifically limited. In the case where the target is made of a single substance, the shape is preferably circular or annular for example, and the target is desirably arranged concentrically to the respective cathode.

Furthermore, the target can also be made of a complex of semicircular alloy target pieces which respectively contain Co and Cr, semicircular oxide target pieces which contain oxide(s) such as cobalt oxide, and the like.

The first gas inlet pipe 46 to the fourth gas inlet pipe 49 having a shape shown in FIG. 4, are respectively arranged inside the reaction container 23.

Each of the first gas inlet pipe 46 to the fourth gas inlet pipe 49 has a straight tube portion 50 extending in one direction, and an annular part 51 in a ring shape which is connected to one end of the straight tube portion 50. In the inner peripheral wall of the annular part 51, a plurality of gas outlet apertures 51a are provided at approximately equal intervals along the circumference.

In addition, preferably, the diameter of the gas outlet aperture 51a provided in the first gas inlet pipe 46 to the fourth gas inlet pipe 49 is varied depending on the position of the straight tube portion 50 connected to the respective gas inlet pipe, so that the gas emission amount from each aperture can be constant. That is, it is preferable to reduce the diameter on the gas upstream side in each gas inlet pipe, and to enlarge the diameter on the downstream side.

As to the first gas inlet pipe 46 to the fourth gas inlet pipe 49, the other end of each straight tube portion 50 is extended and respectively connected to the gas feeder 24 which is equipped outside the reaction container 23.

Moreover, the annular part 51 of each gas inlet pipe is respectively arranged on the periphery of the first target 42 to the fourth target. That is, the annular part 51 of each gas inlet pipe is arranged to enclose the periphery of the plasma generation space between each target and the film-formation substrate 22.

Between the gas feeder 24 and the first gas inlet pipe 46 to the fourth gas inlet pipe 49, a valve is respectively equipped partway along each pipe. The valve is respectively configured so that it can be controllably opened and closed by a control mechanism (not shown).

The mixture gas sent out by the gas feeder 24 is respectively introduced in the first gas inlet pipe 46 to the fourth gas inlet pipe 49 while the flow rate is controlled by each valve mentioned above. The mixture gas introduced in each inlet pipe flows into the annular part 51 through the straight tube portion 50, and then is discharged from the plurality of gas outlet apertures 51a arranged in a ring shape, toward the central part of the annular part 51.

In the apparatus of this embodiment, an argon-water containing gas is used as the mixture gas.

Moreover, as shown in FIG. 2, the first exhauster 25 and the second exhauster 26 are respectively connected to the top and the bottom of the reaction container 23.

The first exhauster 25 and the second exhauster 26 respectively decompress the interior of the reaction container 23, and discharge the gas inside the reaction container 23 at a predetermined flow rate at the time of film formation by reactive sputtering, through the operation of respective vacuum pumps.

The first exhauster 25 and the second exhauster 26 respectively comprise: vacuum pumps 52, 53, and 54; gate valves 55, 56, and 57 which are respectively connected to these vacuum pumps, and controllably opened and closed by a control mechanism (not shown); and a first exhaust pipe 58 and a second exhaust pipe 59.

The first exhaust pipe 58 connects between the gate valves 55 and 56 and the first exhaust vent 40. The second exhaust pipe 59 connects between the gate valve 57 and the second exhaust vent 41.

The exhauster device of this embodiment is desired to be able to quickly exhaust the gas inside the reaction container 23. In order to quickly exhaust the gas inside the reaction container 23, it is necessary to reduce the volume of the reaction container 23 while improving the exhaust capacity of the vacuum pump.

However, in order to improve the exhaust capacity of the vacuum pump, the size of the vacuum pump and the diameter of a flange portion for attaching the vacuum pump to the reaction container 23 have to be enlarged. For this reason, a large flange portion is required for the reaction container 23. As a result, the reaction container 23 has to be enlarged, too.

In this embodiment, the attachment flanges of the vacuum pumps 52, 53 and 54 which constitute the first exhauster 25 and the second exhauster 26 are arranged in parallel to the target plane. Moreover, the two attachment flanges of the vacuum pumps 52 and 53 which constitute the first exhauster 25 are arranged in parallel to face each other. By so doing, even though a large number of large-sized vacuum pumps having large exhausting capacities are attached, the volume of the reaction container 23 can be kept small.

The number of the vacuum pumps 52, 53, and 54 held by the first exhauster 25 and the second exhauster 26 may be either one or plural. When a plurality of vacuum pumps is used, the gas inside the reaction container 23 can be more efficiently exhausted.

However, if the number of vacuum pumps is too large, the size of the apparatus and the power consumption may increase. Therefore, the number of vacuum pumps held by each exhauster is desirably two at most. In addition, the numbers of vacuum pumps in the respective exhausters may be the same or different.

The vacuum pumps 52, 53, and 54 used in the first exhauster 25 and the second exhauster 26 are not specifically limited, although cryopumps and turbo-molecular pumps are desirable.

Specifically, since the turbo-molecular pump does not use oil, a high cleanliness factor and a high degree of vacuum can be given. For this reason, the gas inside the reaction container 23 can be efficiently exhausted.

In this embodiment, the first exhauster 25 comprises two turbo-molecular pumps 52 and 53, and the second exhauster 26 comprises a cryopump 54.

Therefore, the gas inside the reaction container 23 can be efficiently exhausted while suppressing increases in the size of the apparatus and the power consumption. Since this kind of the cryopump is a storage-type pump, less impurities are generated from the pump, and a clean exhaust environment can be kept inside the reaction container.

The substrate conveying device 27 transfers the two film-formation substrates 22 that have been delivered from the outside, respectively between the first target 42 and the third target 44, and between the second target and the fourth target, so that the substrates can be vertically placed.

This substrate conveying device 27 has a substrate conveyer 38, a carrier conveyer 60, and a first carrier 61 and a second carrier held by the carrier conveyer 60. The second carrier and a second carrier holder described later have similar structures to those of the first carrier 61 and a first carrier holder 62 described later. The drawings thereof are thus not shown.

A substrate delivering section is provided on the side wall 30 and 31 of the reaction container. The interior thereof is communicated with the space inside the reaction container 23. Moreover, this substrate delivering section is provided with an opening for delivering the substrate from the outside, and a gate valve (not shown) for opening and closing this opening.

The first carrier 61 and the second carrier hold some parts of the peripheries of the film-formation substrates 22 respectively in a detachable manner. Their movements are controlled by the operation of a movement controlling mechanism 63, from the vicinity of the opening of the substrate delivering section, respectively to the first reaction space (space between the first target 42 and the third target 44) and to the second reaction space (space between the second target and the fourth target).

This carrier conveyer 60 horizontally moves the carrier holder 62 in a non-contact manner by moving a magnet. Upon the delivery of the substrates, the first carrier 61 and the second carrier are located in the vicinity of the opening of the substrate delivering section. Then, the respective carriers carrying the two film-formation substrates 22 are delivered from the opening of the substrate delivering section, and the first carrier 61 and the second carrier are controlled to move to the respective reaction spaces by the operation of the movement controlling mechanism 63.

By so doing, the film-formation substrates 22 carried on the respective carriers are vertically placed respectively between the first target 42 and the third target 44, and between the second target and the fourth target.

In this state, the opposite principal planes of one of the film-formation substrates 22 respectively face the electrode planes of the first cathode 32 and the third cathode 34, and distances thereof to the respective electrode planes are substantially equal. In addition, the opposite principal planes of the other film-formation substrate 22 also respectively face the electrode planes of the second cathode 33 and the fourth cathode, and distances thereof to the respective electrode planes are substantially equal.

In this state, when electric power is supplied to the respective first cathode 32 to the fourth cathode, the mixture gas supplied to these reaction spaces changes into plasma. Ions of the inert gas generated in this plasma collide with the first target 42 to the fourth target, and thereby the target substance (sputtered particles) is ejected from each target.

A part of the ejected sputtered particles reacts with the activated reactive gas, and is thereby coated over each surface of the film-formation substrate 22. By so doing, magnetic layers having a granular structure are formed in parallel on both sides of the two film-formation substrates 22.

Next is a description of the magnetic layer formation method using this film formation apparatus 21.

First, the first carrier 61 and the second carrier carrying the film-formation substrates 22 are moved respectively to the space between the first target 42 and the third target 44, and to the space between the second target and the fourth target, by the operations of the substrate conveying device 27 and the movement controlling mechanism 63.

Next, the gate valves 55, 56, and 57 are opened. Then, the interior of the reaction container 23 and the interior of the substrate conveyer 38 are decompressed by the operations of the vacuum pumps 52, 53, and 54 of the first exhauster 25 and the second exhauster 26.

The pressure is preferably set at $5 \times 10^{-5}$ Pa or lower, more preferably $1 \times 10^{-5}$ Pa or lower, and most preferably $5 \times 10^{-6}$ Pa or lower. The base pressure of the reaction container is preferably as low as possible.

Here, special equipment is not placed in the area from the first exhauster 25 to the space between the first target 42 and the third target 44, and to the space between the second target and the fourth target, which are respectively opposed to sandwich the film-formation substrates 22. On the other hand, the carrier conveyer 60, in a complicated shape including the first carrier 61 and the second carrier, is provided in the area from the second exhauster 26 to the space between the first target 42 and the third target 44, and to the space between the second target and the fourth target, which are respectively opposed to sandwich the film-formation substrates 22.

Accordingly, the upper space of each target can be sufficiently decompressed by the first exhauster 25, whereas the lower space of each target can not be sufficiently decompressed by the first exhauster 25 because the carrier conveyer 60 interferes with the decompression.

Therefore, the second exhauster 26 operates effectively in order to efficiently decompress this carrier conveyer 60 and the surrounding space.

That is, since the second exhauster 26 is provided very close to the carrier conveyer 60 and the surrounding space, the carrier conveyer 60 and the surrounding space can be efficiently decompressed.

By so doing, the first exhauster 25 and the second exhauster 26 can cooperatively exhaust the gas in the whole interior of the reaction container 23 more quickly than heretofore.

If the second exhauster 26 is not provided, there is only the first exhauster 25 on the topmost side of the reaction container 23. Therefore, when a movement controlling mechanism having a complicated structure sits on the bottommost side, this movement controlling mechanism part is likely to interfere with the decompression, so that there is an inconvenience in that it takes more time than necessary to decompress the reaction container 23 to a desired level.

According to the constituent of this embodiment, this inconvenience can be avoided by providing the second exhauster 26 close to the movement controlling mechanism, in addition to the first exhauster 25.

Thereafter, the first gate valve 55 to the third gate valve 57 are controlled to adjust the flow rate of the gas being discharged from the first exhaust vent 40 and the second exhaust vent 41, at a predetermined level.

The mixture gas introduced into the first to fourth gas inlet pipes 46 to 49 passes through the annular part 51, then emits from the respective gas outlet apertures 51a to the vicinity of the peripheral part of each target (each electrode unit), and flows toward the central part of each target.

In addition, in this embodiment, an argon-water containing gas is used as the mixture gas. Although the amount of water in the argon-water mixture gas depends on the composition of the magnetic layer to be formed, the water content is preferably 0.1 to 20 volume % relative to the total amount of argon and water. It is not preferable if the water content exceeds 20 volume %, since it leads to Co oxidization and too large an amount of oxide in the magnetic film, which impairs the electromagnetic conversion characteristics of the magnetic film. Moreover, it is not preferable if the water content is less than 0.1 volume %, since it leads to insufficient separation of the magnetic grains in the granular structure of the magnetic film as well as leading to residual Cr in the magnetic grains, which also impair the electromagnetic conversion characteristics.

Furthermore, the flow rate of the mixture gas is suitably determined according to the volume of the reaction container and the exhaust capacity of the exhauster device, so as to achieve an appropriate pressure of the sputtering gas.

In this manner, by using a mixture gas made by adding water to argon, the relative amount of argon in the gas decreases. As a result, the hardness of the magnetic layer and the scratch resistance of the magnetic recording medium are improved.

Moreover, each target for use in this embodiment preferably contains Cr in a form of other than the oxide thereof, and preferably in a faun of a CrPt alloy, a CrCoPt alloy, or a CrCoPtRu alloy. Furthermore, the target preferably contains oxide(s). Preferable examples of such oxide are Si oxide, Ti oxide, W oxide, Co oxide, Ta oxide, and Ru oxide.

Specifically, each of the targets can contain CoCrPt—Co oxide-Si oxide, CoCrPt—Co oxide-Ti oxide, CoCrPt—Co oxide-W oxide, CoCrPt—Co oxide-Co oxide, CoCrPt—Co oxide-Ta oxide, CoCrPt—Co oxide-Ru oxide, CoRuPt—Co oxide-Si oxide, CoCrPtRu—Co oxide-Si oxide, or the like.

Next, a voltage is applied to the first cathode 32 to the fourth cathode.

By so doing, the mixture gas changes into plasma in the space corresponding to each cathode. Ions of the inert gas generated in this plasma collide with each target, and thereby the target substance (sputtered particles) is ejected from the target. A part of the ejected sputtered particles reacts with the activated reactive gas while the other part of the particles does not react with the reactive gas. In this state, these particles are coated over each surface of the respective film-formation substrate 22.

As to the plasma condition necessary to decompose water into oxygen radicals and hydrogen radicals, preferably, the interior pressure of the reaction container 23 is 0.1 to 10 Pa, more preferably 0.1 to 5 Pa, the film formation rate is 0.1 to 100 nm/s, the temperature of the film-formation substrate is 100 to 300° C., the power is 100 to 2000 W, and the power input system uses a DC power source or an RF power source.

In this embodiment, as described above, an argon-water containing gas is used as the mixture gas.

Argon has a function to stabilize the generation of reactive plasma. In addition, water is decomposed into oxygen radicals and hydrogen radicals in the reactive plasma. Therefore, the distribution of the radical concentration in the reaction area is uniformized.

Accordingly, in the invention of this application, the magnetic grains and the oxide grain boundaries can be separated even if the gas pressure is low.

Moreover, the oxygen radicals react with chromium other than the oxide thereof contained in the target, so that the chromium turns into chromium oxide that forms grain boundaries of the magnetic layer having the granular structure. That is, because the chromium intakes oxygen to form the magnetic layer, the oxygen concentration in the magnetic layer is uniformized in the plane direction.

In addition, the hydrogen radicals react with the cobalt oxide contained in the target, so that the cobalt oxide turns into cobalt as a constituent of the magnetic grains in the magnetic layer having the granular structure. Furthermore, the hydrogen radicals induce a reduction reaction, so that the magnetic grains can be kept from being oxidized. For example, if particles of CoCrPt-xCo oxide-Si oxide grains are used as the target, the magnetic layer would be formed of $Co_{1+x}Cr_{1-x}Pt$—Si oxide-xCr oxide.

By so doing, a granular magnetic layer having excellent magnetic properties can be formed.

Furthermore, in the film formation apparatus 21 of this embodiment, the mixture gas emitting from the respective gas outlet apertures 51*a* of the gas inlet pipes 46, 47, 48, and 49 flows from the peripheral parts toward the central parts in the vicinities of the surfaces of the first target 42 to fourth target. Then, the flow is respectively canceled by the flow of the mixture gas emitting from the opposing gas outlet apertures 51*a*.

For this reason, disturbance of plasma generated in the space between each target and film-formation substrate 22 caused by a flow of the mixture gas can be avoided, and thereby the plasma (space) formed in the space between each target and film-formation substrate 22 can be kept stable. In particular, when the water-containing mixture gas is used, the radical distribution can be further uniformized by allowing the mixture gas to flow from the periphery toward the center.

Since the reacted gas is smoothly discharged from the top and the bottom of the reaction container 23 by the first exhauster 25 and the second exhauster 26, the plasma space is less likely to flow in a certain direction by the flow of the gas being discharged.

By so doing, the gas flows in between each film-formation substrate 22 and the plasma, where the formation of a plasma-free space can be suppressed.

Through these events, in this film formation apparatus 21, the film formation by reactive sputtering can be accelerated, and the magnetic layers deposited on the surfaces of the film-formation substrate 22 can be uniformized. That is, in this film formation apparatus 21, highly uniform magnetic layers can be quickly formed.

Then, the film formation is terminated when layers of the sputtered particles (magnetic recording layers 6) reach a predetermined level on both sides of the film-formation substrates 22.

In the above-mentioned manner, the magnetic recording layers 6 are formed in parallel on both sides of the two film-formation substrates 22. The thus formed magnetic recording layers 6 are respectively made of uniformly deposited sputtered particles. Therefore, uniform magnetic properties in the plane direction and stable recording-and-reproducing properties can be given.

Figure 5:
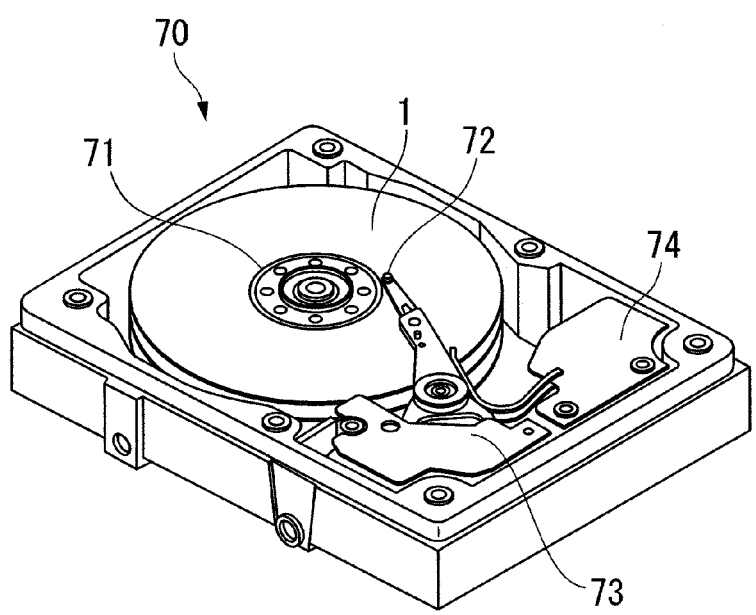
FIG. 5 is a schematic block diagram illustrating an example of a magnetic recording and reproducing apparatus, to which is applied the perpendicular magnetic recording medium wherein magnetic layers are formed by the magnetic layer formation method of the invention.

FIG. 5 illustrates an example of a magnetic recording and reproducing apparatus using the above-mentioned perpendicular magnetic recording medium.

The magnetic recording and reproducing apparatus 70 shown in FIG. 5 comprises; a perpendicular magnetic recording medium 1 having the structure shown in FIG. 1, a medium driver 71 for rotatably driving the magnetic recording medium 1, a magnetic head 72 for recording data in or reproducing data from the magnetic recording medium 1, a head driver 73 for moving this magnetic head 72 relative to the magnetic recording medium 1, and a recording and reproducing signal processing system 74.

The recording and reproducing signal processing system 74 is capable of processing externally-entered data to transmit a recording signal to the magnetic head 72, and processing a reproducing signal from the magnetic head 72 to transmit the data to the outside.

As to the magnetic head 72 for use in this magnetic recording and reproducing apparatus 70, a magnetic head suitable for higher density recording can be appropriately employed, such as those having a GMR element based on the giant magnetoresistance (GMR) effect, a TuMR element based on the tunnel effect, or the like.

Hereunder is a specific description of the invention, with reference to examples. The film composition units are all expressed in mole %.

EXAMPLE

A glass substrate in a shape of a 2.5-inch hard disk (MEL3 manufactured by Konica Minolta) was placed in the vacuum chamber of a C-3040 sputtering apparatus manufactured by ANELVA.

The sputtering apparatus was evacuated until the degree of vacuum reached $1\times10^{-5}$ Pa or lower. Then, 10 nm-thick Cr layers as adhesive layers, 15 nm-thick 70Co—20Fe—5Ta—5Zr layers as underlayers, 0.8 nm-thick Ru layers, and 15 nm-thick 70Co—20Fe—5Ta—5Zr layers were formed on both sides of the substrate.

Next, 10 nm-thick 94Ni—6W layers as orientation control layers and 20 nm-thick Ru layers as ground layers were formed thereon.

An Ar gas was used for sputtering. The underlayers and the 94Ni—6W layers were formed at a gas pressure of 0.8 Pa while the Ru ground layers were formed at a gas pressure of 8 Pa.

Next, the thus formed substrate was placed in the reactive sputtering apparatus (film formation apparatus) shown in FIG. 2 and FIG. 3, where perpendicular magnetic recording layers (having a composition of 92(70Co-10Cr-16Pt-4B)-4($TiO_2$)-4($CrO_2$) in a thickness of 8 nm) were formed on both sides of the substrate.

Here, the composition of the target was 89(63Co-17Cr-16Pt-4B)-4($TiO_2$)-7(CoO).

The raw material gas that was introduced in the gas inlet pipes was made by mixing argon at a flow rate of 100 sccm and water at a flow rate of 1.5 sccm. This mixture gas was emitted from sixteen gas outlet apertures (small pores each having an inner diameter of 0.5 mm) provided at equal intervals in an annular part having an outer diameter of 200 mm inside the gas inlet pipe.

The substrate temperature was set at 150° C., a DC magnetron was used for sputtering, and electric power of 550 W was charged.

At the time of reactive sputtering, the interior pressure of the container was set at 3 Pa, and the effective exhaust capacity was set at 800 liter/second on the upper side and 300 liter/second on the lower side.

In addition, two turbo-molecular pumps were provided on the upper side of this reactive sputtering apparatus while one turbo-molecular pump was provided on the lower side. At the time of film formation, the reactive gas was discharged so that the total effective exhausting rate reached 600 liter/second on the upper side and 350 liter/second on the lower side.

Next, 0.3 nm-thick Ru layers and 4.5 nm-thick 69Co-20Cr-9Pt-2B magnetic layers were formed. Then, the substrate was transferred to a CVD film formation apparatus, where 4 nm-thick carbon protective layers were formed on the substrate by CVD.

The magnetic recording medium was produced in the above-mentioned process.

The thus produced magnetic recording medium was applied with a lubricant, and was subjected to an evaluation for the recording-and-reproducing properties by using a Read/Write Analyzer 1632 and a Spinstand S1701MP manufactured by GUZIK Technical Enterprises of the U.S.A.

The recording-and-reproducing properties were measured by evaluating the signal-to-noise ratio (SNR, where S refers to an output at a linear recording density of 576 kFCI and N refers to an rms (root mean square) value at a linear recording density of 576 kFCI), and by evaluating the OW value (reproduced output ratio (attenuation rate) of a 576 kFCI signal obtained by a difference before and after a once-recorded signal having a linear recording density of 576 kFCI was overwritten with a signal having a linear recording density of 77 kFCI).

As a result, the magnetic recording medium was found to have excellent electromagnetic conversion characteristics, showing an Hc value of 5284 Oe, an Hn value of 2911 Oe, an OW value of 32.3 dB, and an SNR value of 10.75 dB.

COMPARATIVE EXAMPLE

A magnetic recording medium was produced in the same manner as that of the above-mentioned example, except that the formation of the granular-structured magnetic layer was performed not by reactive sputtering but by sputtering with use of a target having the same composition as that of the magnetic layer of interest (a composition of 92(70Co-10Cr-16Pt-4B)-4($TiO_2$)-4($CrO_2$)). Argon was used for the sputtering gas.

As a result, the magnetic recording medium was found to be inferior to the above-mentioned example, by showing an He value of 3800 Oe, an Hn value of 1730 Oe, an OW value of 50.46 dB, and an SNR value of 8.93 dB.

The granular-structured magnetic layers formed in the example and the comparative example were observed by planar TEM, both cases of which showed magnetic grains having a mean diameter of about 8 nm. However, the magnetic grains of the comparative example did not show a clear magnetic field. From this result, the hardness of the granular-structured magnetic layer formed in the comparative example was assumed to be lower than that of the magnetic layer of the example.

This comparison elucidated that it is important to supply an argon-water mixture gas upon sputtering, and it is also important that the target composition contains chromium other than the oxide thereof and cobalt oxide.

As mentioned above, while preferred examples have been described, it should be understood that they are exemplary of the invention and are not to be considered as limiting. Additions, omissions, substitutions of the construction, and other modifications can be made without departing from scope of the gist of the invention. Accordingly, the invention is not to be considered as being limited by the forgoing description, and is only limited by the scope of the appended claims.

INDUSTRIAL APPLICABILITY

The invention can be utilized over a wide range in the manufacturing industry to produce magnetic recording media.

The invention claimed is:

1. A method of forming a magnetic layer for use in a magnetic recording medium in which a magnetic layer having a granular structure containing at least cobalt and chromium is formed on both sides of a substrate by reactive sputtering, which comprises:
   placing said substrate in a reaction container;
   arranging a pair of electrode units comprising sputtering electrodes and targets which are disposed on surfaces of the sputtering electrodes and which contain chromium other than the oxide thereof and cobalt oxide, so that the electrode units respectively face both sides of said substrate while said targets are on the substrate sides;
   feeding an argon-water mixture gas to vicinities of the respective surfaces on the substrate sides of said pair of electrode units;
   applying reactive sputtering so that the chromium other than the oxide thereof contained in said targets can be made into chromium oxide as a constituent to form the magnetic layer having the granular structure; and
   applying reactive sputtering so that the cobalt oxide contained in said targets can be made into cobalt as a constituent to form magnetic grains in the magnetic layer having the granular structure.

2. The method of forming a magnetic layer according to claim 1, wherein the magnetic layer is formed by reactive sputtering while feeding the argon-water mixture gas to the vicinities of the respective surfaces on the substrate sides of said pair of electrode units so that the gas can flow from the peripheral parts toward the central parts, as well as discharging a post-reaction waste gas from the longitudinally opposite ends of said reaction container.

3. The method of forming a magnetic layer according to claim 1, wherein said magnetic layer is a perpendicular magnetic layer whose magnetic anisotropy is perpendicular to the surface of the substrate.

4. The method of forming a magnetic layer according to claim 1, wherein said magnetic layer contains, in addition to the chromium oxide, one or more types of oxide(s) selected from the group consisting of Si oxide, Ti oxide, W oxide, Co oxide, Ta oxide, and Ru oxide, as a grain boundary constituent for forming the granular structure.

5. The method of forming a magnetic layer according to claim 1, wherein the thickness of said magnetic layer is within a range of 1 nm to 15 nm.

6. The method of forming a magnetic layer according to claim 1, wherein said magnetic layer contains oxide(s) within a range of 3 mole % to 15 mole %.

7. The method of forming a magnetic layer according to claim 1, wherein said substrate is a disk-shaped substrate for use in a magnetic recording medium, and said magnetic layer having the granular structure is a magnetic recording layer in the magnetic recording medium.

8. The method of forming a magnetic layer according to claim 1, which comprises:
   arranging on the substrate sides of said pair of electrode units, a gas inlet pipe whose inner peripheral wall is provided with a plurality of gas outlet apertures annularly along the circumference; and
   introducing said mixture gas into said gas inlet pipe and discharging the gas from the respective gas outlet apertures to thereby feed said mixture gas to the vicinities of the respective surfaces on the substrate sides of said pair of electrode units, so that the gas flows from the peripheral parts toward the central parts.

9. The method of forming a magnetic layer according to claim 2, wherein an exhauster device for discharging said waste gas comprises a turbo-molecular pump.

10. The method of forming a magnetic layer according to claim 2, wherein an exhauster device for discharging said waste gas comprises a cryopump.

11. The method of forming a magnetic layer according to claim 2, wherein the method employs an apparatus which comprises a first exhauster for discharging said waste gas from one longitudinal end of said reaction container and a second exhauster for discharging the gas from the other end, and at least either one of these exhausters has two vacuum pumps.

12. The method of forming a magnetic layer according to claim 1, wherein a plurality of pairs of said electrode units are used, and magnetic layers are formed in parallel on both sides of a plurality of substrates.

* * * * *